(12) United States Patent
Wallace et al.

(10) Patent No.: US 9,405,074 B1
(45) Date of Patent: Aug. 2, 2016

(54) OPTICAL CURRENT TRANSDUCER ALIGNMENT

(71) Applicant: General Electric Company, Schenectady, NY (US)

(72) Inventors: Daniel Robert Wallace, Syracuse, NY (US); Brian Timothy Ross, Fort Edward, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/797,583

(22) Filed: Jul. 13, 2015

(51) Int. Cl.
*G02B 6/36* (2006.01)
*G01D 5/26* (2006.01)
*B29C 70/34* (2006.01)
*B32B 3/10* (2006.01)

(52) U.S. Cl.
CPC ............ *G02B 6/3652* (2013.01); *G01D 5/268* (2013.01); *G02B 6/3608* (2013.01); *G02B 6/3616* (2013.01); *G02B 6/3676* (2013.01)

(58) Field of Classification Search
CPC ........ B28C 33/03; B29C 33/42; B29C 70/34; B29C 39/04; B32B 3/10; G01D 5/268; G01J 4/00; G02B 6/26

USPC ............... 385/11–14; 156/245; 378/147, 149; 250/231 R, 225, 227; 428/156
See application file for complete search history.

(56) References Cited

U.S. PATENT DOCUMENTS

| | | | |
|---|---|---|---|
| 4,492,860 A * | 1/1985 | Brogardh | G01D 5/268 250/227.21 |
| 7,141,812 B2 * | 11/2006 | Appleby | B29C 33/302 250/505.1 |
| 7,785,098 B1 * | 8/2010 | Appleby | B29C 33/302 264/319 |
| 2011/0189440 A1 * | 8/2011 | Appleby | B22C 9/04 428/156 |
| 2012/0249133 A1 | 10/2012 | Friedrich | |

* cited by examiner

*Primary Examiner* — Akm Enayet Ullah
(74) *Attorney, Agent, or Firm* — Parks IP Law LLC; Stephen J. Terrell

(57) ABSTRACT

Methods and devices for aligning an optical current transducer are provided. The aligning includes, using a novel fixture having a predetermined grooved pattern therein, mounting, in a first groove of the pattern, a first portion of a cable of the optical current transducer and a polarizer unit of the optical current transducer. Further, the aligning can include mounting, in a second groove of the pattern, a second portion of the cable and a mirror unit of the optical current transducer.

20 Claims, 6 Drawing Sheets

100

400

500

501

502

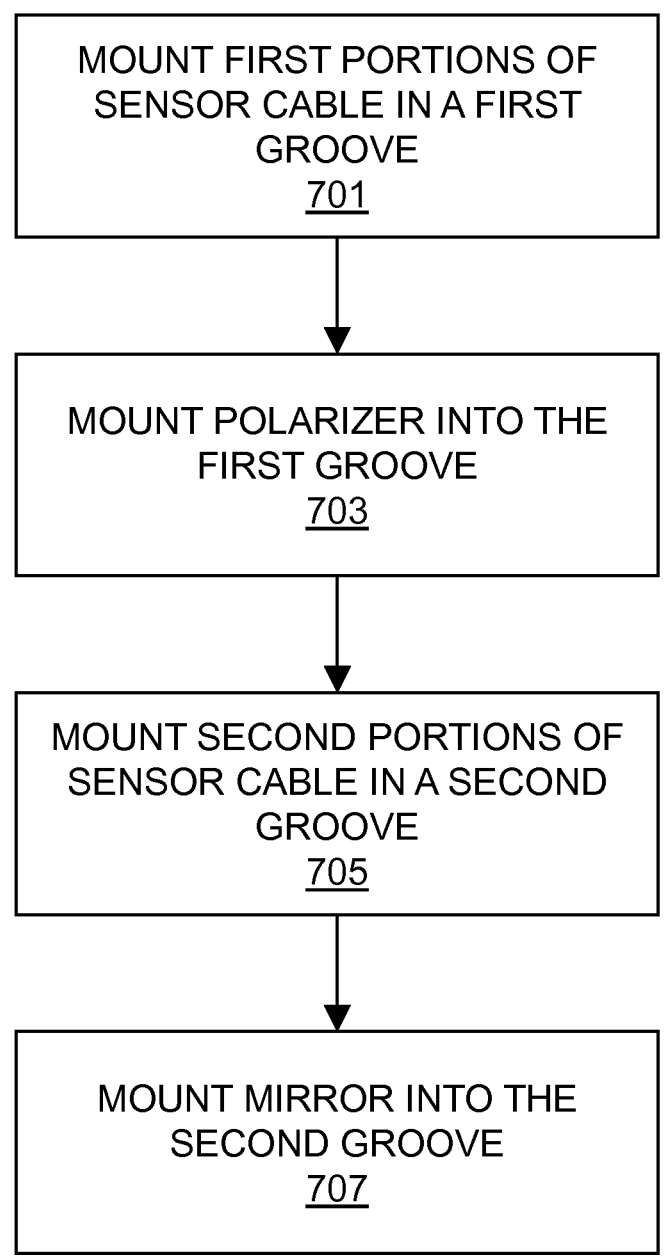

OPTICAL CURRENT TRANSDUCER ALIGNMENT

I. FIELD OF THE INVENTION

The present disclosure generally relates to optical current transducers. More particularly, the present disclosure relates to optical current transducer alignment.

II. BACKGROUND OF THE INVENTION

Fiber-optic current transducers (FOCTs) can be used to detect alternating currents in transmission lines. FOCTs operate based on the principle of Faraday rotation, which is a magneto-optical effect whereby a rotation of the polarization plane of a light beam confined in a fiber-optic waveguide placed near the transmission line occurs in response to a magnetic field induced by the current in the transmission line. The angle of the rotation is linearly proportional to the component of the magnetic field in the direction of light propagation in the waveguide. As such, a change in angle can be correlated with the strength of the magnetic field, which can in turn be used to calculate the current in the transmission line.

An FOCT can be used to detect an alternating current using a differential current measurement configuration. In such a measurement scheme, one or more conductors pass through a common fiber-optic loop of the FOCT. This configuration only works if the current in the conductors algebraically add to zero. For example, for a normal 3-phase transmission system, the currents are 120 degrees out of phase from one another, and they algebraically add to zero. Therefore, the current in the transmission system can be detected by the FOCT, simply by monitoring a differential current in the transmission system. Similarly, for a single phase transmission system, currents in the conductors are 180 degrees out of phase, and they add up to zero.

In differential current measurements, improper alignment between a polarizer unit and a mirror unit of the fiber-optic loop can lead to large phase and amplitude root-mean-squared (RMS) errors in the measured differential current. As such, since differential current measurements involve currents in the milli-Ampère (mA) regime, the accuracy of a current reading can suffer largely as a result of improper alignment between the polarizer unit and the mirror unit.

III. SUMMARY

The embodiments of the present disclosure help solve or mitigate the above-noted issues as well as other issues known in the art. In one embodiment, there is provided a system for use with an optical current transducer that includes a sensor having a polarizer unit and a mirror unit joined to the polarizer unit by a cable. The system includes an alignment block configured to provide a predetermined arrangement for the sensor. The alignment block includes a first groove that has a primary cross-section and a secondary cross-section, the primary cross-section providing a first feature within the alignment block for holding a first portion of the cable, and the secondary cross-section providing a second feature for holding the polarizer unit.

The alignment block includes a second groove having two distinct cross-sections, the first cross-section being substantially equal in size to the primary cross-section of the first groove, and the second cross-section being substantially equal in size to the secondary cross-section of the first groove. Further, the first cross-section provides a third feature in the alignment block for holding a second portion of the cable, and the second cross-section provides a fourth feature in the alignment block for holding the mirror unit. Furthermore, the mirror unit and the polarizer unit are disposed one of top of the other and at an angle subtended by the first groove and the second groove.

In yet another embodiment, there is provided a method for aligning an optical current transducer. The method includes, mounting in a first groove of a part having a predetermined grooved pattern therein, a first portion of a cable of the optical current transducer and a polarizer unit of the optical current transducer. Further, the method includes, mounting, in a second groove of the part, a second portion of the cable and a mirror unit of the optical current transducer. Furthermore, the mirror unit and the polarizer unit are disposed one of top of the other and at an angle subtended by the first groove and the second groove.

Additional features, modes of operations, advantages, and other aspects of various embodiments are described below with reference to the accompanying drawings. It is noted that the present disclosure is not limited to the specific embodiments described herein. These embodiments are presented for illustrative purposes only. Additional embodiments, or modifications of the embodiments disclosed, will be readily apparent to persons skilled in the relevant art(s) based on the teachings provided.

IV. BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

FIG. 7 is a flow chart depicting a method according to an exemplary embodiment.

V. DETAILED DESCRIPTION OF EMBODIMENTS OF THE PRESENT INVENTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Figure 1:
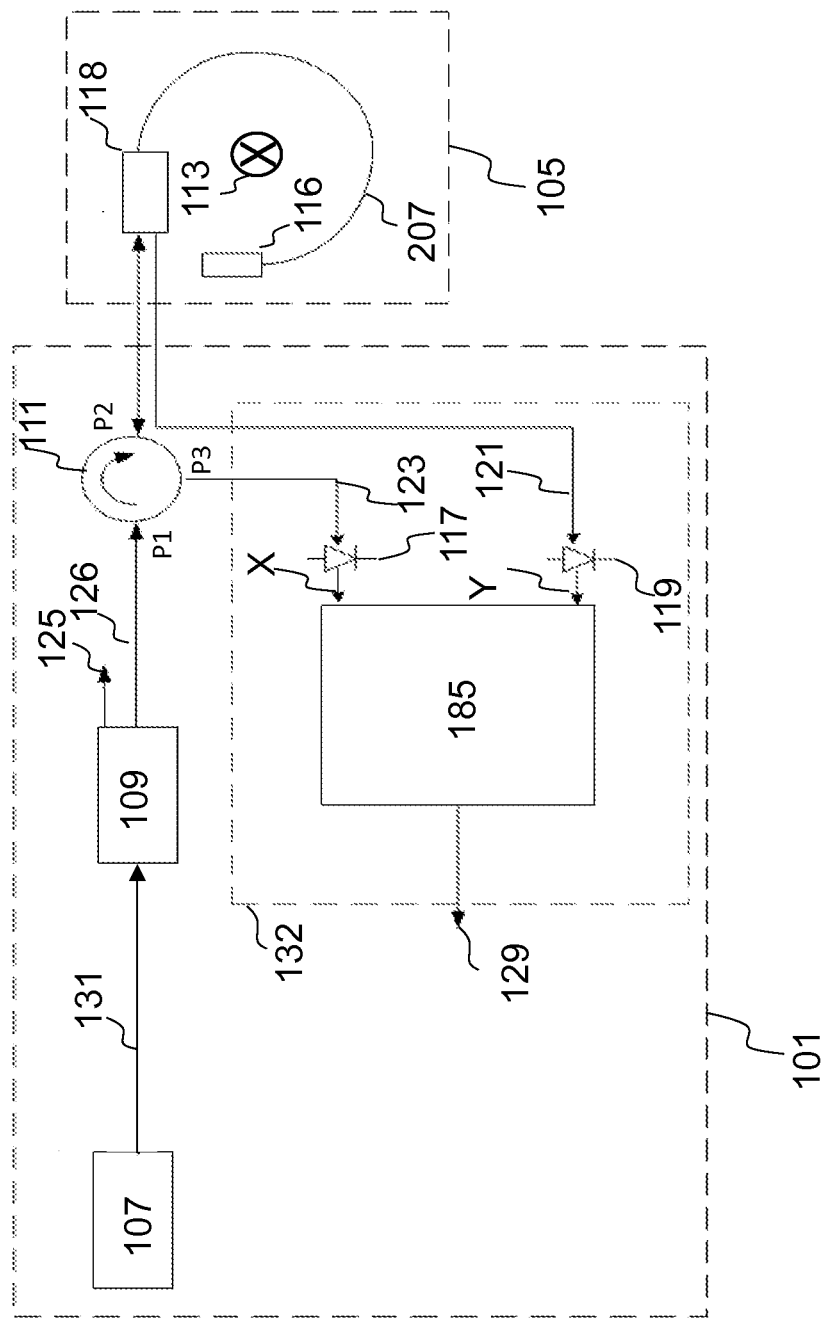
FIG. 1 is an illustration of an optical current transducer system according to an exemplary embodiment.

FIG. 1 is an illustration of a fiber-optic optical current transducer (FOCT) system 100 according to an exemplary embodiment. The FOCT includes a sensor module 105 and a receiver/decoder module 101. The sensor module 105 includes a fiber 207 positioned around a conductor 113. Fiber 207 is a flint cable that is used to sense the current. It is noted that fiber 207 is labeled hereinafter as sensor 207, in order to refer the optical sensing component of system 100.

The receiver module 101 includes a light source 107 that produces a non-polarized light beam 131 for input to an optical splitter 109. The optical splitter 109 is configured to split the light beam 131 into multiple outputs, of which only two are shown (125 and 126).

Output 126 is fed to an optical circulator 111 that allows light to enter a first port (P1) and to exit through a second port (P2). Light returning to the second port (P2) of optical circulator 111 is directed to a third port (P3) of optical splitter 109 of the fiber optic sensor 105 via optical circulator 111. Light beam 131 is coupled to fiber 207 and serves as a probe light beam that changes polarization when current flows in conductor 113. The light in fiber 207 is reflected back into the fiber using an end mirror 116 and back to the receiver 101 via path 123 and path 121. Paths 123 and 121 can be implemented using optical fibers or numerous other wave-guiding devices known in the art.

The light in sensor 207 is reflected back to receiver 101. A processing unit 132 included in receiver 101 is configured to process the reflected light to provide (at terminal 129) a measure of the current in conductor 113. Processing unit 132 includes transducers 117 and 119. These transducers are configured to convert the light beams from path 123 and path 121 into electrical signals X and Y, respectively.

Transducers 117 and 119 can be implemented using PIN diodes. By way of example, and not by limitation, each PIN diode may have a responsivity in the range of about 0.1 [Ampere/Watt] ([A/W]) to about 1 [A/W]. The transducers can also be implemented using other types of photodetector configurations. For example, p-n junctions, photogates, active or passive pixel sensors can be used to implement each of transducer 117 and 119. In general, any phototransducer can be used without departing from the scope contemplated in the present disclosure.

Processing unit 132 includes a system 185 configured to process electrical signals X and Y to produce an output signal at terminal 129, the output signal being indicative of the current in conductor 113. While only terminal 129 is shown in FIG. 1 as an output of processing unit 132 (and of system 185), other output terminals may be present. This may be a digital value stored in memory or an analog value from a D/A converter. Furthermore, while transducers 117 and 119 are shown to be separate from system 185, in some implementations, these transducers can be part of system 185.

Figure 2:
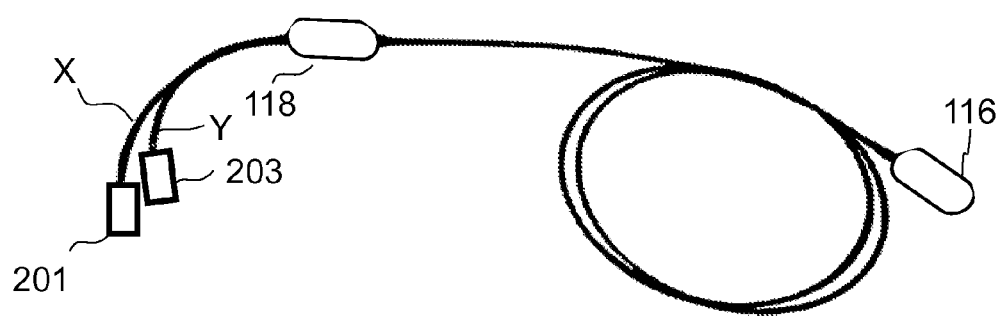
FIG. 2 is an illustration of an optical current transducer sensor cable according to an exemplary embodiment.

FIG. 2 is an illustration of sensor 207 of system 100, according to an embodiment. Sensor 207 can be a flint cable of any length. Sensor 207 includes polarizer unit 118 from which two branches (X and Y) split at one end. These branches are the data fibers that are used to transduce signals on the X and Y paths shown in FIG. 1. The X and Y branches can be terminated using fiber-optic termination connectors 201 and 203, respectively. Furthermore, the sensing fiber extends from the other end of polarizer unit 118 to mirror unit 116.

Figure 3A:
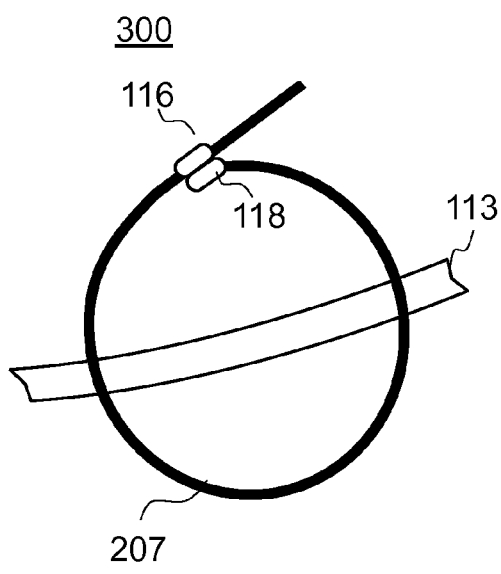
FIG. 3A and FIG. 3B are illustrations of two arrangements of a sensor cable around a current-carrying conductor.
Figure 3B:
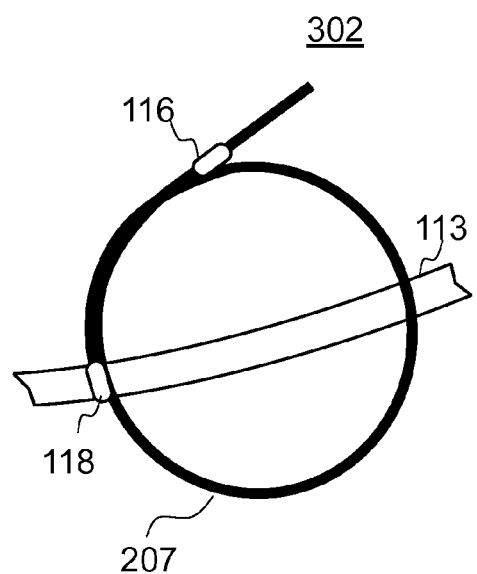

FIG. 3A and FIG. 3B illustrate two arrangements (300 and 302) that can be used to sense a current in conductor 113 using sensor 207. In FIG. 3A, sensor 207 is wrapped around conductor 113 in one full turn and mirror unit 116 and polarizer unit 118 are aligned. In general, any number n of turns where n is an integer will result into proper alignment of mirror unit 116 and polarizer unit 118.

In contrast, in FIG. 3B, sensor 207 is wrapped around conductor 113 in one and a quarter (1¼) turn. The arrangement of FIG. 3B results in a significant misalignment between polarizer unit 118 and mirror unit 116. As such, for situations where several turns are needed and the length of sensor 207 does not allow an integer number of turns, mirror unit 116 and polarizer unit 118 cannot be aligned. This issue is readily apparent when using sensor 207 to make a differential current measurement, as discussed below.

Figure 4:
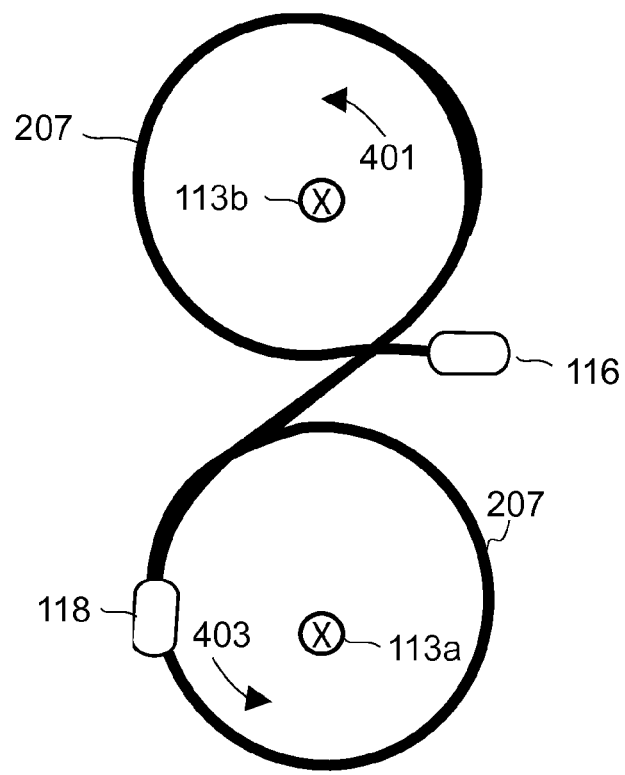
FIG. 4 is an illustration of an optical current transducer cable wrapped around two conductors.

FIG. 4 is an illustration of a differential current measurement scenario 400 using sensor 207. In this situation, sensor 207 is wrapped around two conductors 113a and 113b. In the loop around conductor 113a, sensor 207 is wrapped around the conductor in a first direction 403. In the loop around conductor 113b, sensor 207 is wrapped around the conductor in a second direction 401 that is opposite to first direction 403. As shown in FIG. 4, in a differential current measurement scheme, mirror 116 and polarizer 118 are misaligned. More importantly, however, the number of turns around conductor 113b and 113a are fractional, which yields losses in sensitivity as a result of the flux lines of the magnetic field being improperly coupled to the fiber's material.

Figure 5A:
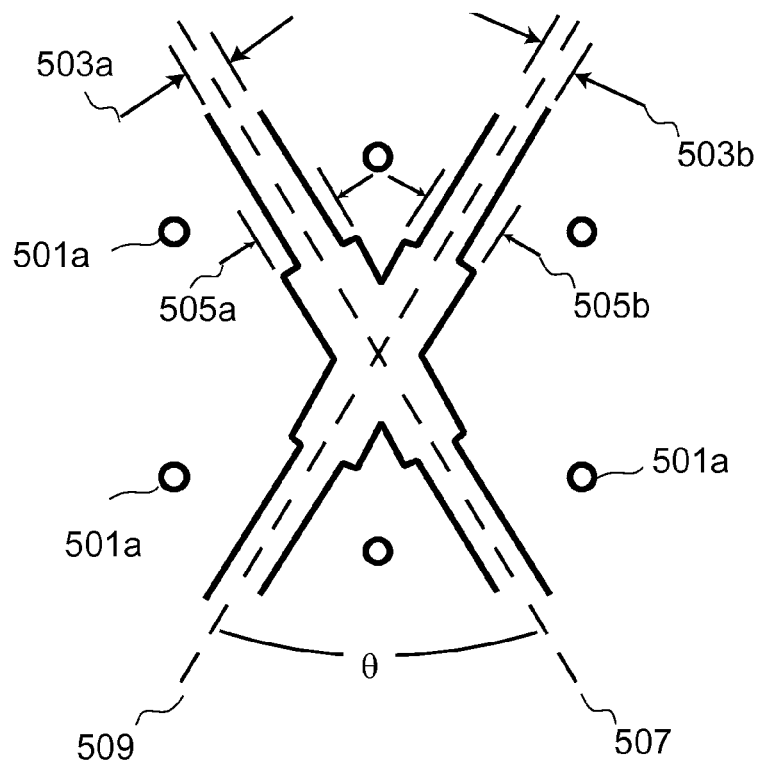
FIG. 5A is an illustration of horizontal cross-sectional view of alignment block according to an exemplary embodiment.
Figure 5B:
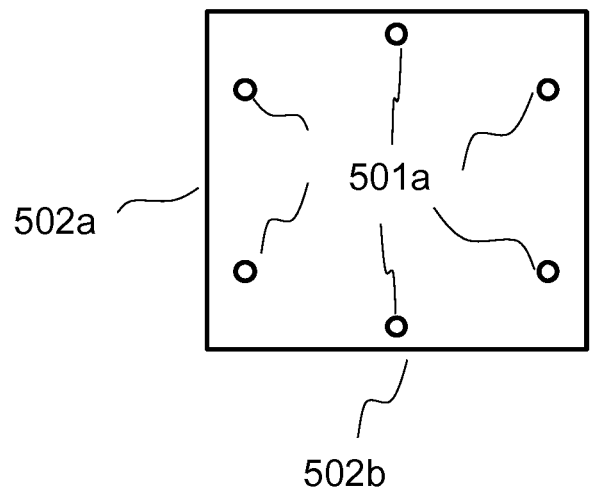
FIG. 5B is a top view of a cover for the alignment block shown in FIG. 5A.
Figure 5C:
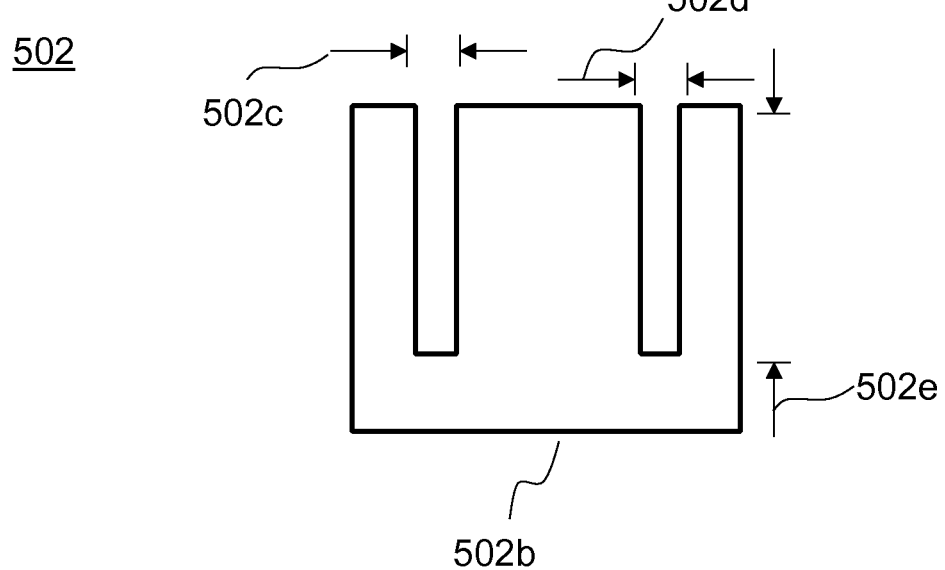
FIG. 5C is a vertical cross-sectional view of the alignment block shown FIG. 5A.

FIG. 5A illustrates a horizontal cross-sectional view of an alignment block configured to remedy the aforementioned issues. Alignment block 500 has width and length 502a and 502b which are shown in FIG. 5B and FIG. 5C but are omitted in FIG. 5A for clarity. Alignment 500 includes two grooves, each being along one of two longitudinal axes (509 and 507). The grooves are disposed such that their longitudinal axes make a predetermined angle θ. In other words, the grooves subtend the angle θ.

The first groove, being along axis 507, has a depth (not shown) and two distinct widths along axis 507. As such, the first groove has two distinct cross-sectional areas. The first cross-sectional area is given by the width of the groove in a first portion and in a second portion, indicated by width 503a. The second cross-sectional area is given by the width of the groove in a third portion, which is indicated by width 505a.

The second groove is similarly configured. Specifically, the second groove, along axis 509, has two distinct cross-sectional areas. The first cross-sectional area is given by width 503b in two regions, and the second cross-sectional area is given by width 505b in a third region.

In some embodiments, width 503a and 503b are substantially similar in size. Similarly, widths 505a and 505b are substantially similar in size. Furthermore, the depth of each groove is also substantially similar in size to the depth of the other groove, and the depth of each groove is uniform along the groove's longitudinal axis. One of skill in the art will readily recognize that the relative dimensions noted above can vary depending the dimensions of the cables of sensor 207 and on the dimensions of the components of sensor 207 (polarizer 118 and mirror 116).

Alignment block 500 may include a plurality of slots 501a that are used to fasten alignment block 500 to a fixed support (not shown). Slots 501a can also be used to mount a cover (not shown) onto alignment block 500.

A cover 501 of alignment block 500 is shown in FIG. 5B. Cover 501 can include a fastening means such as a latch, a lock or the like to fix it onto the body of alignment block 500, in addition to (or instead of) using slots 501a. One of skill in the art will readily recognize that screws, nails, pins or the like can all be used to mount alignment block 500 onto the fixed support. Further, any other method of mounting alignment block 500 to a fixed support and of mounting a cover on alignment block 500 can be used without departing from the scope of the present disclosure.

FIG. 5C shows a vertical cross-sectional view 502 of alignment block 500. Widths 502c and 502d are generally shown to depict the cross-section of alignment block 500, but referring to FIG. 5A, in the appropriate regions of each grooves, widths 502c and 502d are equivalent to one of widths 503a, 503b, 505a, and 505b. Depth 502e is the depth of each of the grooves.

Figure 6A:
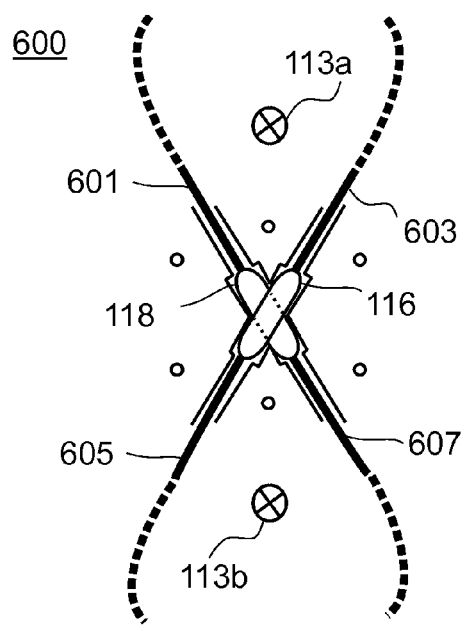
FIG. 6A is an illustration of an optical current transducer cable wrapped around two conductors using an alignment block according to an exemplary embodiment.

FIG. 6A is an illustration of a differential current measurement configuration 600 according to an embodiment. Segments 601, 603, 605, and 607 of sensor 207 are shown with respect to how they fit within alignment block 500. As shown in the figure, sensor 207 is wrapped around conductors 113a and 113b in a similar fashion to the configuration shown FIG. 4. However, in the configuration of FIG. 6A, because alignment block 500 is used, mirror 116 and polarizer 118 can be properly aligned. In other words, they can be aligned so that they are disposed in vertically intersecting planes.

In one embodiment, mirror 116 and polarizer 118 can be placed in the same groove (directly on top one another). The other groove is then there to allow a user to wrap the cable around the conductors in the opposite direction. Doing so provides a signal that is inverted or 180 degrees out of phase. This is equivalent to rotating a conventional CT 180 degrees to change where the polarity dot is. As such, using one FOCT, this embodiment allows the use of a single block, instead of two different blocks, one for each of the two conductors.

This gives sensor 207 an arrangement substantially equivalent to the shape given by the number "8," wherein the current-carrying conductors pass through the holes of the shape of the number "8." Further, in some embodiments, the angle θ can be varied to meet the requirements of the mounting enclosure (FIG. 6B), so that the fiber is not kinked or distorted when installed.

As in FIG. 4, the arrangement of FIG. 6A allows sensor 207 to be wrapped around in a first direction (using any number of turns allowed by the length of the cable) to enclose conductor 113a. Similarly, the arrangement of FIG. 6A allows sensor 207 to be wrapped around in a second direction opposite to the first direction, using any number of turns, to enclose conductor 113b. Ensuring that that the wrapping direction is different for each conductor allows one to account for the difference in polarity of the currents in the two conductors.

Figure 6B:
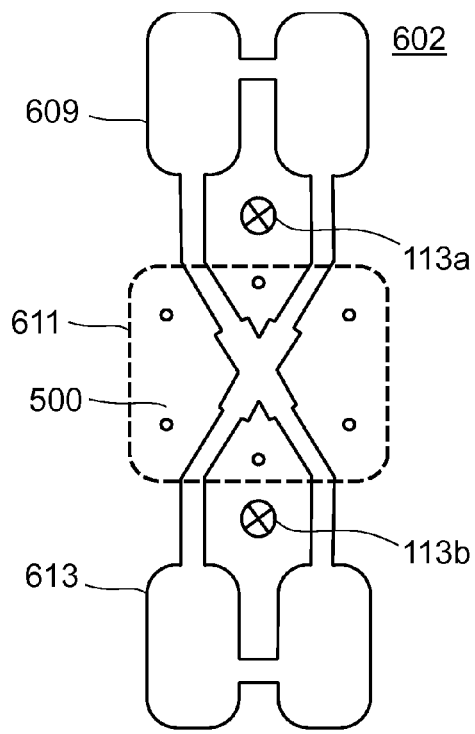
FIG. 6B is an illustration of a fixture for aligning an optical current transducer sensor cable according to an exemplary embodiment.

FIG. 6B is an illustration of a fixture 602 that can be used to arrange sensor 207 in a pattern substantially equivalent to a pattern formed by the number "8," as shown in FIG. 6A. Fixture 602 can include sections 609 and 613, each configured to house portions of sensor 207. Contour 611 shows the outer dimensions of alignment block 500. In one embodiment, sections 609 and 613 may be detachable from alignment block 500. Each of the sections can also be made of detachable parts. Further, while only conductor (113a or 113b) is shown in each loop of fixture 602, it is noted that any number of conductors can pass through each loop to make a differential current measurement.

Furthermore, in one embodiment, the angle θ can be about 60 degrees, the primary cross-section can be 0.3125 inch wide, and the secondary cross-section can be 0.485 inch wide. The depth of each of the grooves can be 2.25 inches, and the size of alignment block 500 can be 3 inches by 3.5 inches for contour 611, and alignment block 500 can be 3 inches thick.

In other embodiments, the angle θ can be between about 20 degrees and about 60 degrees. Further, in an exemplary embodiment, mirror unit 116 and polarizer unit 118 can be 1.575 inch long and 0.4710 inch wide. As previously mentioned, other dimensions can be achieved without departing from the scope of the present disclosure.

In the embodiments of the present disclosure, the angle θ allows mirror unit 116 and polarizer unit 118 to be easily aligned. As such, when each of mirror unit 116 and polarizer unit 118 are placed in alignment block 500, they are easily aligned in two vertically intersecting planes making an internal angle θ. Furthermore, mirror unit 116 and polarizer unit 118, when placed in alignment block 500, are also aligned in the z-direction (i.e. along a normal vector to the drawing sheet of FIG. 5 A). The z-direction distance separating mirror unit 116 and polarizer unit 118 can be chosen to be as small as possible. In some embodiments, that distance can be smaller than 0.15 inches. The smaller the z-direction distance, the better the magnetic field coupling.

In other embodiments, the grooves can be disposed parallel to each other (i.e. angle θ=0). In these embodiments, the groves may be disposed in the x or in the y direction. In this configuration, mirror unit 116 and polarizer unit 118 can be in two parallel vertical planes separated by a short distance (either in the x or in the y direction).

FIG. 7 is a flow chart of a method 700 according to an exemplary embodiment. Method 700 may be used in the context of performing a differential current measurement using the embodiments previously described. Method 700 includes mounting a first portion of a sensor cable (like sensor 207) into one of the grooves of alignment block 500 (step 701). Method 700 includes a step 703 in which the first portion of the sensor cable includes the polarizer unit. The polarizer unit is mounted in the feature of alignment block 500 that is designed to hold the polarizer unit (e.g. see segments 601 and 607 in FIG. 6A which are attached to polarizer unit 118).

Method 700 further includes a step 705 of wrapping a second portion of the sensor cable in a second groove of alignment block 500. Further, method 700 includes a step 707 of mounting the mirror unit in the feature of alignment block 500 that is designed to hold the mirror unit (e.g. see segments 603 and 605 in FIG. 6A which are attached to mirror unit 116).

Method 700 can include wrapping the sensor cable in a fixture like fixture 602 (FIG. 6B). It is noted that wrapping the sensor cable can include making several turns within the fixture so as to provide a predetermined number of turns around the one or more conductors within a loop of the sensor cable.

The methods and apparatuses described herein have several advantages. They allow proper alignment of an FOCT's polarizer section to its mirror section. Using the embodiments, measured differential current waveforms were found to be in phase with a reference waveform, suggesting no phase errors resulting from misalignment. Further, the exemplary alignment block allow an FOCT's sensor cable to be wrapped around the conductors properly and have the polarizer/mirror sections positioned correctly with respect to the conductors and to themselves.

The embodiments described herein allow the installation of a differential optical current transducer to be done quickly without measuring devices or other types of test equipment. Cabling can easily be removed and replaced without changing the alignment between the polarizer and mirror sections. This is because these components can remain in the alignment block, while the cabling is changed. Furthermore, the embodiments provide robustness against vibrations, which in conventional current transducers can cause misalignments and lead to errors.

Further, while this disclosure showed embodiments where one optical current transducer is used, situations where two or more optical current transducers are used to make a differential current measurement can be used. In such cases, the alignment block can include enough grooves to support the number of sensor cables, polarizers, and mirrors used. Alternatively, a fixture like fixture 602 could include several alignment blocks 500, wherein each block is dedicated to one sensor cable like sensor 207.

Moreover, alignment block 500 can be made using any machining or additive manufacturing technique known in the art. Alignment block 500 (or fixture 602) can be made of any material, such as wood or plastic. However, neither alignment block 500 nor fixture 602 can be made of a ferrite material or any other material that would disrupt the induced magnetic field in the conductors.

Those skilled in the relevant art(s) will appreciate that various adaptations and modifications of the embodiments described above can be configured without departing from the scope and spirit of the disclosure. Therefore, it is to be understood that, within the scope of the appended claims, the teachings of the present disclosures may be practiced other than as specifically described herein.

What is claimed is:

1. A system, for use with an optical current transducer comprising a sensor including (i) a polarizer unit and (ii) a mirror unit joined to the polarizer unit by a cable, the system comprising:
    an alignment block configured to provide a predetermined arrangement for the sensor, the alignment block including:
        (i) a first groove having a primary cross-section and a secondary cross-section, the primary cross-section providing a first feature in the alignment block for holding a first portion of the cable, and the secondary cross-section providing a second feature for holding the polarizer unit; and
        (ii) a second groove having a first cross-section and a second cross section, the first cross-section being substantially equal in size to the primary cross-section and the second cross-section being substantially equal in size to the secondary cross-section, and the first cross-section providing a third feature in the alignment block for holding a second portion of the cable, and the second cross-section providing a fourth feature in the alignment block to hold the mirror unit; and
    wherein the mirror unit and the polarizer unit are disposed one of top of the other and at an angle subtended by the first groove and the second groove.

2. The system according to claim 1, wherein the cable includes a fiber-optic cable.

3. The system according to claim 1, wherein the alignment block is made of a non-ferrite material.

4. The system according to claim 1, wherein the alignment block is made of plastic.

5. The system according to claim 1, wherein a longitudinal axis of the first groove and a longitudinal axis of the second groove make an angle between about 20 degrees and about 60 degrees.

6. The system according to claim 1, the predetermined arrangement is substantially equivalent to the shape of the number eight.

7. The system according to claim 1, further comprising a fixture surrounding the sensor.

8. The system according to claim 1, wherein the optical current transducer is configured to perform a differential measurement.

9. The system according to claim 1, the alignment block includes a cover.

10. The system according to claim 1, wherein a cover is mounted on the alignment block using a fastener.

11. The system according to claim 6, wherein one or more conductors is passed through each hole of the shape of the number eight.

12. The system according to claim 11, wherein the one or more conductors carry currents of opposite polarity.

13. The system according to claim 1, wherein the cable is wrapped around two distinct conductors.

14. The system according to claim 13, wherein the cable is wrapped around one conductor in a first direction and around the other conductor in a second direction opposite to the first direction.

15. A method for aligning an optical current transducer using an alignment block having a predetermined grooved pattern, the method comprising:
    mounting, in a first groove of the pattern, (i) a first portion of a cable of the optical current transducer and (ii) a polarizer unit of the optical current transducer; and
    mounting, in a second groove of the pattern, (i) a second portion of the cable and (ii) a mirror unit of the optical current transducer;
    wherein the mirror unit and the polarizer unit are disposed one on top of the other and at an angle subtended by the first groove and the second groove.

16. The method according to claim 15, wherein the cable includes a fiber-optic cable.

17. The method according to claim 15, wherein a longitudinal axis of the first groove and a longitudinal axis of the second groove make an angle having a value between about 20 degrees and about 60 degrees.

18. The method according to claim 15, wherein the first and second grooves each includes two distinct cross-sectional areas.

19. The method according to claim 18, wherein a first cross-sectional area is sized to fit portions of the cable and a second cross-sectional area is sized to fit one of the polarizer unit and the mirror unit.

20. The method according to claim 15, wherein the alignment block is made of a non-ferrite material.

* * * * *